(12) United States Patent
Bartray et al.

(10) Patent No.: US 7,078,708 B2
(45) Date of Patent: Jul. 18, 2006

(54) LITHOGRAPHIC APPARATUS AND METHOD OF MANUFACTURING A DEVICE AND METHOD OF PERFORMING MAINTENANCE

(75) Inventors: Pertrus Rutgerus Bartray, Ysselsteyn (NL); Mustafa Amhaouch, Helden Panningen (NL); Angelo Alexander Michael Van Engelen, Veldhoven (NL); Paulus Martinus Maria Liebregts, Veldhoven (NL); Tim Anton Johan Meesters, Son en Breugel (NL); Franciscus Catharina Bernardus Marinus Van Vroonhoven, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 202 days.

(21) Appl. No.: 10/744,092

(22) Filed: Dec. 24, 2003

(65) Prior Publication Data

US 2005/0139784 A1 Jun. 30, 2005

(51) Int. Cl.
*G03B 27/68* (2006.01)
(52) U.S. Cl. .................... 250/492.2; 355/52; 414/217; 248/638
(58) Field of Classification Search ............ 250/492.2; 355/52; 414/217; 248/638
See application file for complete search history.

(56) References Cited

U.S. PATENT DOCUMENTS

| 5,746,562 | A | 5/1998 | Hasegawa et al. |
| 6,333,775 | B1 | 12/2001 | Haney et al. |
| 6,406,245 | B1 * | 6/2002 | Hasegawa et al. ........... 414/217 |
| 6,606,145 | B1 * | 8/2003 | Irie et al. ...................... 355/72 |
| 2004/0070740 | A1 * | 4/2004 | Irie ............................. 355/52 |

* cited by examiner

*Primary Examiner*—John R. Lee
*Assistant Examiner*—Zia R. Hashmi
(74) *Attorney, Agent, or Firm*—Pillsbury Winthrop Shaw Pittman LLP

(57) ABSTRACT

A lithographic apparatus includes an illumination system for providing a beam of radiation. The lithographic apparatus further includes: a support structure for supporting patterning device, the patterning device serving to impart the beam with a pattern in its cross-section; a substrate table for holding a substrate; and a projection system for projecting the patterned beam onto a target portion of the substrate. The lithographic apparatus includes a vacuum system in which at least the illumination system and the substrate table are present. The vacuum system includes at least two separate vacuum modules. A first vacuum module includes at least the projection system and/or the illumination system. A second vacuum module includes the substrate table. At least two of the vacuum modules are connected to each other via a closable connection.

14 Claims, 2 Drawing Sheets

LITHOGRAPHIC APPARATUS AND METHOD OF MANUFACTURING A DEVICE AND METHOD OF PERFORMING MAINTENANCE

BACKGROUND OF THE INVENTION

1. Field of the Invention

The present invention relates to a lithographic apparatus, a method of manufacturing a device, and a method of performing maintenance.

2. Brief Description of Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

Some types of lithographic apparatuses, such as those using an electron beam or an ion beam, have to be operated in a vacuum environment. For instance, lithographic apparatuses projecting electromagnetic radiation in the Extreme Ultraviolet (EUV) range require a vacuum, inter alia because gas molecules absorb this type of radiation and because hydrocarbons and water react under the influence of EUV radiation and contaminate the lithographic apparatus. To prevent these deterring effects, it is known to provide a vacuum system comprising a single vacuum chamber in which a lithographic apparatus is positioned. The vacuum chamber is connected to a vacuum pump system and can be pumped to a level of vacuum to operate the lithographic apparatus.

However, a draw-back of this prior art solution is that there is a high risk of contamination of the vacuum system, because different parts of the lithographic apparatus are handled and touched during assembly and maintenance of the lithographic apparatus. Each of those parts can become contaminated, for example with grease, dust, or otherwise. If the contaminated parts are positioned in the vacuum, they can release gases and other contaminants. Accordingly, the level of vacuum to operate the lithographic apparatus can not be obtained.

From the U.S. Pat. No. 6,333,775, a photolithographic apparatus is known. The apparatus includes a housing defining a vacuum chamber. Trays are situated in the vacuum chamber, which separate the vacuum chamber into compartments which are at different pressures. The tray is supported by a support member, and adjoined to an inner surface of the housing by structure for adjoining. The structure for adjoining may comprise a conductance limiting seal. A tray which separates a reticle zone from an optics zone is provided with an aperture.

A drawback of the photolithographic apparatus known from this prior art document is that it has relatively long downtime because, when the vacuum is reduced a relatively long period of time may be required to pump the vacuum chamber back to the vacuum level when operating the photolithographic apparatus.

SUMMARY

An aspect of the present invention is to provide a lithographic apparatus with a relatively short downtime.

According to one aspect of the invention, there is provided a lithographic apparatus comprising: an illumination system constructed to provide a beam of radiation; a support structure constructed to support a patterning device, the patterning device serving to impart a cross-section of the beam with a pattern to form a patterned beam; a substrate table for holding a substrate; a projection system that projects the patterned beam onto a target portion of the substrate; and a vacuum system in which at least the illumination system and the substrate table are disposed, the vacuum system having at least two separate vacuum modules including a first vacuum module including the illumination system and a second vacuum module including the substrate table, the separate vacuum modules being connected to each other by a closable connection Such a lithographic apparatus has a relatively short downtime, because the vacuum of a separate module in which a part of the lithographic apparatus to be serviced is present can, at least partially, be released without affecting the vacuum in other vacuum modules. The time to bring the serviced module back to the suitable vacuum level is less than the time to pump an entire vacuum system down to the suitable vacuum level. Accordingly, the downtime of the lithographic apparatus is reduced. By optimizing the frequency at which the lithographic apparatus is serviced with respect to the pump capacity, the downtime can be reduced further.

Additionally, such a lithographic apparatus has a reduced risk of contamination of the vacuum, because if a part of the lithographic apparatus is contaminated, this part can be closed-off from the other modules and that vacuum module is contaminated only, while the other vacuum modules remain uncontaminated. Thus, only a, relatively small, part of the entire vacuum system is contaminated. Furthermore, the lithographic apparatus has a short manufacturing cycle because the vacuum modules can be manufactured and tested simultaneously and the vacuum module can be assembled into the vacuum system.

Furthermore, for instance, a vacuum module may be separated by closing the connection in order to be filled with a leak detection gas or be removed for servicing or otherwise, without affecting the pressure in other vacuum modules. Also, a certain level of vacuum can be maintained in some parts, while other parts may be at a higher level of vacuum. Accordingly, the requirements for the vacuum system as a whole can be reduced.

According to an embodiment of the invention, the lithographic apparatus further comprises at least one of a projection beam vacuum module in which the projection system is present; an illumination system vacuum module in which the illumination system is present; a handler vacuum module in which a handler is present for handling a substrate or a patterning device, and/or a support structure vacuum module in which the support structure is present, and a radiation source vacuum module in which a radiation source is present.

Thereby, at least some of the moving systems of the lithographic apparatus are present in a separate vacuum module, and accordingly contamination of the optical components, e.g. the illumination system and/or the projection system, or other stationary systems by the moving parts is reduced.

In a further embodiment of the invention, at least two of the vacuum modules are connected to each other via a gas passage provided with a valve system for at least partially closing the gas passage, which valve system comprises a first valve at a first vacuum module side of the passage and a second valve at a second vacuum module side of the passage. Thereby, a vacuum module can be removed from the vacuum system, for example to be serviced or replaced, with a low risk of affecting the vacuum in other vacuum modules.

According to another aspect of the invention, a method is provided for performing maintenance on a lithographic apparatus, comprising: providing a vacuum system including at least two separate vacuum modules including a first vacuum module and a second vacuum module, the first vacuum module being connected to the second vacuum module by a closable connection; increasing the pressure in one of the first and second vacuum modules while maintaining the vacuum inside the other of the first and second vacuum modules, and performing maintenance in the one vacuum module in which the pressure is increased.

In such a method, the pressure is increased in only a part of the vacuum system. Accordingly, the time to reduce the pressure after maintenance is reduced, because less space has to be pumped back to the desired vacuum level compared to a single chamber vacuum system.

Furthermore, if a vacuum module has a leakage, the other vacuum module can remain at the set vacuum level. Also, leaks in a vacuum module can be detected accurately because leak detection can be applied to a separate vacuum module. Thus, which specific vacuum module has a leak can be determined in a simple manner.

In an embodiment of the invention, the pressure in at least one of the vacuum modules is increased to substantially an environmental pressure of an environment in which the lithographic apparatus is positioned. Thereby, the vacuum module can be accessed easily without vacuum forces acting on the vacuum module when accessing the vacuum module.

In an embodiment of the invention, the pressure is increased above an environmental pressure of an environment in which the lithographic apparatus is positioned. Thereby, leaks in the vacuum module can be detected easily, because a gas will flow from the vacuum module to the environment through the leak.

In an embodiment of the invention, the pressure is at least partially increased by inserting a leak detection gas in at least one of the vacuum modules. Thereby, leak detection can be performed on each vacuum module separately. Thus, for each vacuum module leakage can be determined separately, and accordingly, in which part of the vacuum system a leak is present can be determined easily.

In an embodiment of the invention, a gas is introduced in another vacuum module connected to the at least one maintained vacuum module. This way, the connection between those vacuum modules does not have to withstand large forces and thus can be very small, and accordingly the out-gassing area of the valve itself can be very small.

According to a further aspect of the invention, there is provided a lithographic apparatus comprising: an illumination system constructed to provide a beam of radiation; a substrate table for holding a substrate; and a vacuum system including at least two separate vacuum modules, the at least two separate vacuum modules being connected to each other by a closable connection including a valve system for at least partially closing the closable connection, the valve system including a first valve at a first vacuum module side of the closable connection and a second valve at a second vacuum module side of the closable connection.

Such a lithographic apparatus employs a vacuum module positioned in the lithographic apparatus to reduce the risk of contamination of the vacuum system by parts of the lithographic apparatus which are contaminated with vacuum deterring substances.

According to a further aspect of the invention, there is provided a a method of manufacturing a device comprising: providing a substrate; forming a beam of radiation; imparting a cross-section of the beam of radiation with a pattern to form a patterned beam of radiation; projecting the patterned beam of radiation onto a target portion of the substrate, wherein at least one of the forming a beam of radiation and projecting the patterned beam is performed in a first vacuum module, and the substrate is provided in a second vacuum module, and the first vacuum module is connected to the second vacuum module via a closable connection.

Thereby, downtime is reduced because the vacuum of a separate module in which a part of the lithographic apparatus to be serviced is present can, at least partially, be released, without affecting the vacuum in other vacuum modules. The time to bring the serviced module back to the suitable vacuum level is less than the time to pump an entire vacuum system down to the suitable vacuum level. Accordingly, downtime is reduced. Furthermore, the tools for performing the method have a short manufacturing cycle because the vacuum modules can be manufactured and tested simultaneously and the vacuum modules can be assembled into the vacuum system.

Additionally, by performing such a method, the risk of contamination of the vacuum is reduced, because if a part of the lithographic apparatus is contaminated, this part contaminates the vacuum in a vacuum module only, and the other vacuum modules remain uncontaminated. Thus, only a, relatively small, part of the entire vacuum system is contaminated.

Furthermore, if a vacuum module has a leakage, the other vacuum module can remain at the set vacuum level. Also, leaks in a vacuum module can be detected accurately because a leak detection method can be applied to a separate vacuum module. Thus, which specific vacuum module has a leak can be determined in a simple manner.

According to a further aspect of the invention, there is provided a lithographic apparatus comprising: first vacuum means for providing a first vacuum to a first module; second vacuum means for providing a second vacuum to a second module; and means for connecting the first and second vacuum means to selectively close a connection between the first and second vacuum means.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" or "patterning structure" used herein should be broadly interpreted as referring to a device or structure that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF ILLUSTRATED EMBODIMENTS

Figure 1:
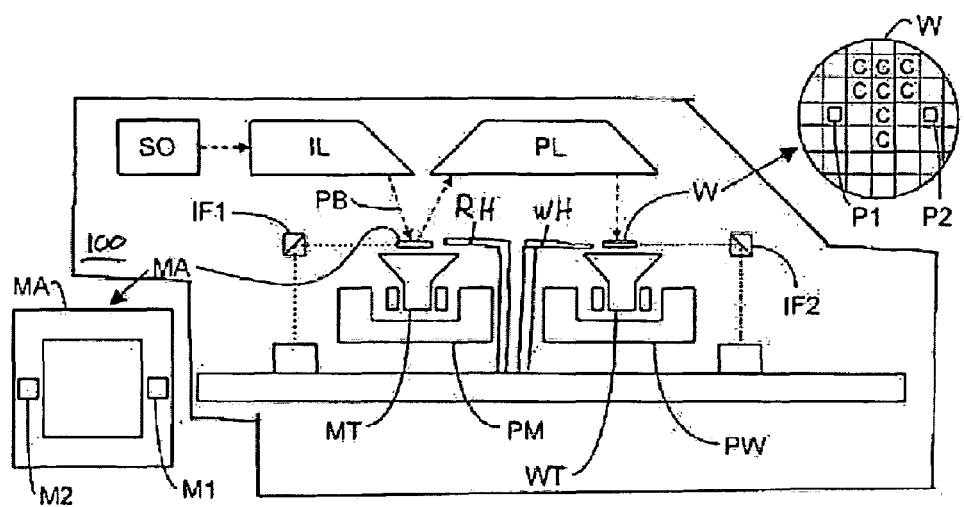
FIG. 1 depicts a lithographic apparatus according to an embodiment of the invention.

FIG. 1 schematically depicts a lithographic apparatus according to an embodiment of the invention. The apparatus comprises: an illumination system (illuminator) IL for providing a projection beam PB of radiation (e.g. UV or EUV radiation); a first support structure (e.g. a mask table) MT for supporting a patterning device (e.g. a mask) MA and connected to first positioning structure PM for accurately positioning the patterning device with respect to item PL; a substrate table (e.g. a wafer table) WT for holding a substrate (e.g. a resist-coated wafer) W and connected to second positioning structure PW for accurately positioning the substrate with respect to item PL; and a projection system (e.g. a reflective projection lens) PL for imaging a pattern imparted to the projection beam PB by patterning device MA onto a target portion C (e.g. comprising one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives a beam of radiation from a radiation source SO. The source and the lithographic apparatus may be separate entities, for example when the source is a plasma discharge source. In such cases, the source is not considered to form part of the lithographic apparatus and the radiation beam is generally passed from the source SO to the illuminator IL with the aid of a radiation collector comprising for example suitable collecting mirrors and/or a spectral purity filter. In other cases the source may be integral part of the apparatus, for example when the source is a mercury lamp. The source SO and the illuminator IL, may be referred to as a radiation system.

The illuminator IL may comprise an adjuster that adjusts the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross-section.

The projection beam PB is incident on a patterning device, illustrated in the form of the mask MA, which is held on the mask table MT. Being reflected by the mask MA, the projection beam PB passes through the lens PL, which focuses the beam onto a target portion C of the substrate W.

With the aid of the second positioning structure PW and position sensor IF2 (e.g. an interferometric device), the substrate table WT can be moved accurately, e.g. so as to position different target portions C in the path of the beam PB. Similarly, the first positioning structure PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning structures PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes.

In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the magnification, demagnification, and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device may be updated after each movement of the substrate table WT or in between successive radiation pulses during a scan. This mode of operation can be readily applied to maskless lithography that utilizes programmable patterning devices, such as a programmable mirror array of a type as referred to above.

Combinations and/or variations on the above described modes of use or entirely different modes of use may also be employed.

The lithographic apparatus shown in FIG. 1 further has a patterning device handler system RH, from hereon referred to as the reticle handler RH, which can transfer the pattering device, e.g. the reticle or mask, to the mask table MT, for example from a mask storage outside the lithographic apparatus in which several masks are stored or otherwise. The lithographic apparatus also has a substrate handler WH, which can transfer the substrate W to the wafer table WT, for example from a wafer storage outside the lithographic apparatus in which several wafers are stored or otherwise.

Figure 2:
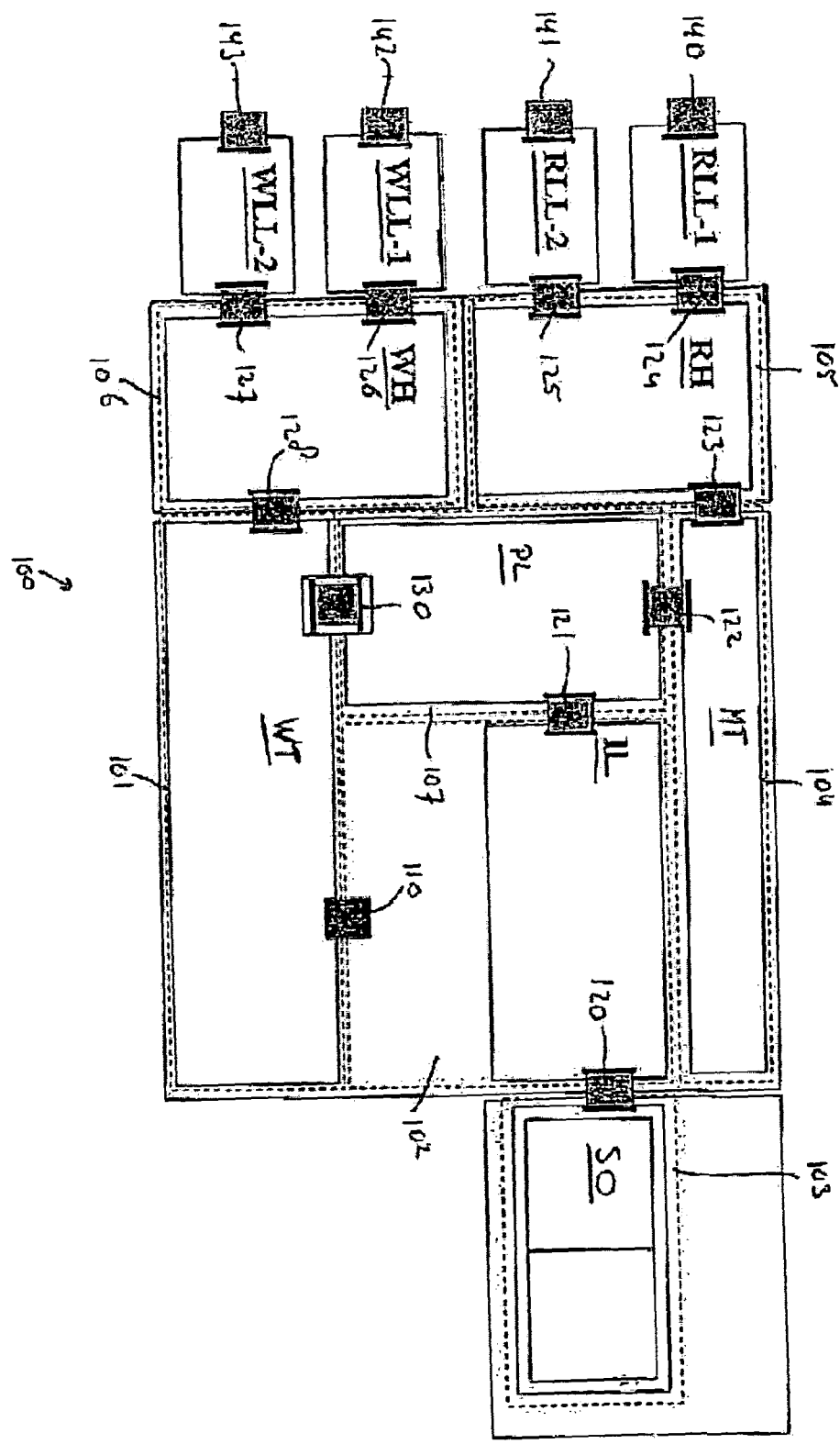
FIG. 2 schematically shows a block diagram of an embodiment of a vacuum system of a lithographic apparatus according to an embodiment of the invention.

As shown in FIG. 1, the lithographic apparatus is positioned in a vacuum system 100. FIG. 2 schematically shows a block diagram of the vacuum system 100. As shown in FIG. 2, the vacuum system 100 comprises vacuum modules 101–107, as indicated with the dashed lines.

As shown in FIG. 2, the substrate table WT is positioned in a substrate table vacuum module 101. The illumination system IL is present in an illumination system vacuum module 102. The projection beam PB is placed in a projection beam vacuum module 107. Thus, at least the parts of the lithographic apparatus which are subject to the most stringent vacuum requirements, e.g. the optical parts of the lithographic apparatus, are positioned in a separate vacuum module. Therefore, the risk of contamination of the optical parts is reduced in the part of the lithographic apparatus which is most sensitive to contamination. Furthermore, the lithographic apparatus has a short manufacturing cycle because the vacuum modules can be manufactured and tested simultaneously and the vacuum module can be assembled into the vacuum system.

In addition, other parts of the lithographic apparatus are positioned in separate vacuum modules as well. For example, the radiation source SO is received in a radiation source vacuum module 103.

The systems in the lithographic apparatus which have many moving component parts are each positioned in separate vacuum modules as well. It is found that the risk of contamination is relatively large in systems with moving parts. Accordingly, by positioning those systems in separate vacuum modules, the risk is reduced effectively. In addition, those systems have to be serviced relatively often. Accordingly, downtime of the lithographic apparatus due to servicing is reduced significantly, because only a vacuum module for the respective system has to be accessed and pumped down after servicing.

In the example of FIG. 2, the systems with a, relatively, large amount of moving components are the first support structure MT, which is present in a support structure vacuum module 104, the reticle handler RH, which is received in a reticle handler vacuum module 105, and the wafer handler WH, which is positioned in a wafer handler vacuum module 106. However, depending on the specific lithographic apparatus, other systems of the lithographic apparatus may likewise comprise a relatively large amount of moving components, and be positioned in a separate vacuum module.

The lithographic apparatus further has reticle load locks RLL-1, RLL-2 by which the patterning devices MA, e.g. masks or reticles, can be fed into and removed from the vacuum modules 101–107, as well as wafer load locks WLL-1, WLL-2, via which substrates can be fed into or removed from the vacuum modules 101–107.

When operated, masks and substrates can be positioned in a corresponding load lock via load passages 140–143 respectively. During the positioning of objects in a load lock, the respective load lock may be at the pressure of the environment surrounding the lithographic apparatus. Thereafter, the load passages 140–143 can be closed of by a single side valve system provided in the load passages 140–143. Then, the load lock can be pumped down to the level of vacuum present in the vacuum module directly connected to the load lock, e.g. the reticle handler vacuum module 105 and the wafer handler vacuum module 106, for example.

As shown in the example of FIG. 2, one or more of the vacuum modules can be separated from other vacuum modules with respect to the pressure by closing a closeable connection between the vacuum modules. In this example, each vacuum module is connected via a gas passage 120–128,130 to other vacuum modules. The gas passages 120–128, 130 are provided with a dual side valve system, that is a valve system comprising a first valve at a first vacuum module side of the passage and a second valve at a second vacuum module side of the passage 120–128, 130. Thereby, for each vacuum module 101–107 an effective shielding from the other vacuum modules can be obtained when that other vacuum module is serviced, by closing the connection with the valve at the side of the vacuum module. Alternatively, the gas passages 120–128, 130 can be provided with single side valves. When the valves are open, for example, radiation, or a wafer can be transported from one vacuum module to another vacuum module through the respective passage.

In this example, each of the reticle load locks RLL-1, RLL-2 is directly connected via a passage 124,125 to the vacuum system 100, i.e. in this example to the reticle handler vacuum module 105. Each of the wafer load locks WLL-1, WLL-2 is directly connected via a passage 126,127 to the vacuum system 100, i.e. in this example to the wafer handler vacuum module 106. The reticle handler vacuum module 105 is connected via a passage 123 to the mask table vacuum module 104. The wafer handler vacuum module 106 is connected via a passage 128 to the substrate table vacuum module 101. The mask table vacuum module 104 is connected via a passage 122 to the projection system vacuum module 107. The substrate table vacuum module 101 is connected via a passage 130 to the projection system vacuum module 107 as well. The substrate table vacuum module 101 is further connected via a passage 110 to the illumination system vacuum module 102. The projection system vacuum module 107 and the illumination system vacuum module 102 are connected to each other via a passage 121. The illumination system vacuum module 102 is further connected to the radiation source vacuum module 103 via a passage 120.

A lithographic apparatus according to an embodiment of the invention can be serviced by increasing the pressure in at least one of the vacuum modules, while maintaining the vacuum inside at least one of the other vacuum module. For instance, the valves in the respective passages 120–128,130 can be closed. Maintenance can be performed in the at least one vacuum module of which the pressure is increased. Thereby, downtime of the lithographic apparatus is reduced because after servicing only the serviced vacuum module has been pumped down to the desired level of vacuum instead of the whole vacuum system.

When servicing, the pressure in at least one of the vacuum modules can, for instance, be increased to substantially an environmental pressure of an environment in which the lithographic apparatus is positioned or above the environmental pressure of an environment in which the lithographic apparatus is positioned. In the first case, when opening the vacuum module to be serviced, there will be substantially no flow of gas because of the absence of a pressure difference between the vacuum module and the environment. In the latter case, leaks in the serviced vacuum module can be detected easily, because a gas will flow from the vacuum module to the environment through the leak.

For the detection of leaks in the vacuum system, it is likewise possible to introduce a leak detection gas, such as nitrogen, in one or more of the vacuum modules 101–107, while closing the valves in the passages to the other vacuum modules. Thereby, leak detection can be performed on each vacuum module separately. Thus, for each vacuum module a leak can be determined separately, and accordingly, in which part, i.e. which vacuum module, of the vacuum system a leak is present can be determined easily.

While specific embodiments of the invention have been described above, it will be appreciated that aspects of the invention may be practiced otherwise than described in the above and that the description is not intended to limit aspects of the invention. For instance, the lithographic apparatus may project any suitable type of radiation, such as a type of radiation in the group comprising electromagnetic radiation, electron radiation, ion radiation, or otherwise. The electromagnetic radiation may for example be electromagnetic radiation with a wavelength in the range of ultra-violet, deep ultra-violet, extreme ultraviolet, gamma radiation, or otherwise.

Also, for instance, the distributions of the systems of the lithographic apparatus over the respective vacuum modules can be different. For example, one or more of the vacuum module shown in FIG. 2 can be combined. For instance, the mask table vacuum module 104, the projection system vacuum module 107 and the illumination system vacuum module 102 can be combined into a single vacuum module comprising the mask table MT, the projection system PL and the illumination system IL.

Furthermore, for example, the vacuum system can comprise a large vacuum chamber in which the lithographic apparatus is positioned, which is provided with one or more smaller vacuum chambers which operate as the vacuum modules in which systems of the lithographic apparatus as placed. Also, in each vacuum module different levels of vacuum can be present. For instance in the substrate table vacuum module 101, the space below the substrate table WT may be separated from the space above to prevent outgassing of the positioning structures reaching, and contamination of the substrate W.

It should be noted that in the above, when the vacuum level is increased, the pressure is reduced, and vice versa.

What is claimed is:

1. A lithographic apparatus comprising:
    an illumination system constructed to provide a beam of radiation;
    a support structure constructed to support a patterning device, said patterning device serving to impart a cross-section of said beam with a pattern to form a patterned beam;
    a substrate table for holding a substrate;
    a projection system that projects said patterned beam onto a target portion of said substrate; and
    a vacuum system in which at least said illumination system and said substrate table are disposed, said vacuum system having at least two separate vacuum modules including a first vacuum module including said illumination system and a second vacuum module including said substrate table, said separate vacuum modules being connected to each other by a closable connection.

2. A lithographic apparatus according to claim 1, wherein said vacuum system includes a beam vacuum module in which said projection system is present.

3. A lithographic apparatus according to claim 1, wherein said vacuum system includes a handler vacuum module in which a handler is present, said handler structured to handle one of said substrate and said patterning device.

4. A lithographic apparatus according to claim 1, wherein said vacuum system includes a support structure vacuum module in which said support structure is present.

5. A lithographic apparatus according to claim 1, wherein said vacuum system includes a radiation source vacuum module in which a radiation source is present.

6. A lithographic apparatus according to claim 1, wherein said closable connection between at least two of said vacuum modules includes a valve system for at least partially closing said closable connection, said valve system including a first valve at a first vacuum module side of said closable connection and a second valve at a second vacuum module side of said closable connection.

7. A method for performing maintenance on a lithographic apparatus, comprising:
providing a vacuum system including at least two separate vacuum modules including a first vacuum module and a second vacuum module, the first vacuum module being connected to the second vacuum module by a closable connection;
increasing the pressure in one of the first and second vacuum modules while maintaining the vacuum inside the other of the first and second vacuum modules, and performing maintenance in the one vacuum module in which the pressure is increased,
wherein the first vacuum module comprises an illumination system and the second vacuum module comprises a substrate support.

8. A method according to claim 7, wherein the increasing the pressure in one of the vacuum modules includes increasing the pressure to substantially an environmental pressure of an environment in which the lithographic apparatus is positioned.

9. A method according to claim 7, wherein the increasing the pressure in one of the vacuum modules includes increasing the pressure above an environmental pressure of an environment in which the lithographic apparatus is positioned.

10. A method according to claim 7, wherein the increasing the pressure in one of the vacuum modules includes at least partially increasing the pressure by inserting a leak detection gas in at least one of the vacuum modules.

11. A method according to claim 7, further comprising:
introducing a gas in another vacuum module, which is connected to the other of the two vacuum modules.

12. A lithographic apparatus comprising:
an illumination system constructed to provide a beam of radiation;
a substrate table for holding a substrate; and
a vacuum system including at least two separate vacuum modules, said at least two separate vacuum modules being connected to each other by a closable connection including a valve system for at least partially closing said closable connection, said valve system including a first valve at a first vacuum module side of said closable connection and a second valve at a second vacuum module side of said closable connection.

13. A method of manufacturing a device comprising:
providing a substrate;
forming a beam of radiation;
imparting a cross-section of the beam of radiation with a pattern to form a patterned beam of radiation;
projecting the patterned beam of radiation onto a target portion of the substrate,
wherein at least one of the forming a beam of radiation and the projecting the patterned beam is performed in a first vacuum module, and the substrate is provided in a second vacuum module, and the first vacuum module is connected to the second vacuum module via a closable connection.

14. A lithographic apparatus comprising:
a first vacuum module comprising an illumination system for providing a beam of radiation;
a second vacuum module comprising a support for supporting a substrate; and
a closable connection between said first and second vacuum modules.

* * * * *